United States Patent
Hu et al.

(10) Patent No.: US 9,867,282 B2
(45) Date of Patent: Jan. 9, 2018

(54) CIRCUIT BOARD WITH CORNER HOLLOWS

(71) Applicants: Suming Hu, North York (CA); Neil McLellan, Austin, TX (US); Andrew K W Leung, Markham (CA); Jianguo Li, Scarborough (CA)

(72) Inventors: Suming Hu, North York (CA); Neil McLellan, Austin, TX (US); Andrew K W Leung, Markham (CA); Jianguo Li, Scarborough (CA)

(73) Assignees: ATI Technologies ULC, Markham (CA); Advanced Micro Devices, Inc., Sunnyvale, CA (US)

( * ) Notice: Subject to any disclaimer, the term of this patent is extended or adjusted under 35 U.S.C. 154(b) by 157 days.

(21) Appl. No.: 14/451,757

(22) Filed: Aug. 5, 2014

(65) Prior Publication Data
US 2015/0049441 A1 Feb. 19, 2015

Related U.S. Application Data

(60) Provisional application No. 61/866,698, filed on Aug. 16, 2013.

(51) Int. Cl.
*H05K 1/00* (2006.01)
*H05K 1/18* (2006.01)
(Continued)

(52) U.S. Cl.
CPC .......... *H05K 1/0271* (2013.01); *H01L 23/13* (2013.01); *H01L 23/49838* (2013.01);
(Continued)

(58) Field of Classification Search
CPC ......... H01L 2924/0002; H01L 2924/00; H01L 23/13; H01L 23/49816; H01L 23/49838; H01L 2924/14; H01L 2924/3511; H05K 1/0271; H05K 2201/09027; H05K 2201/09154; H05K 2201/2009; H05K 2201/2018
See application file for complete search history.

(56) References Cited

U.S. PATENT DOCUMENTS 5,072,283 A * 12/1991 Bolger ................. H01L 23/057
257/672
5,866,943 A  2/1999 Mertol
(Continued)

FOREIGN PATENT DOCUMENTS

JP          9283889     10/1997
JP          3161706      8/2000
(Continued)

OTHER PUBLICATIONS

USPTO Office Action notification dated Feb. 20, 2015; U.S. Appl. No. 13/436,177.
(Continued)

*Primary Examiner* — Yuriy Semenenko
(74) *Attorney, Agent, or Firm* — Timothy M. Honeycutt

(57) ABSTRACT

A method of manufacturing is provided that includes singulating a circuit board from a substrate of plural of the circuit boards, wherein the circuit board is shaped to have four corner hollows. The corner hollows may be various shapes.

20 Claims, 6 Drawing Sheets

(51) Int. Cl.
*H05K 7/00* (2006.01)
*H05K 1/02* (2006.01)
*H05K 3/00* (2006.01)
*H01L 23/13* (2006.01)
*H05K 3/34* (2006.01)
*H01L 23/498* (2006.01)

(52) U.S. Cl.
CPC ...... *H05K 3/0052* (2013.01); *H01L 23/49816* (2013.01); *H01L 2924/0002* (2013.01); *H01L 2924/14* (2013.01); *H01L 2924/3511* (2013.01); *H05K 3/3442* (2013.01); *H05K 2201/09027* (2013.01); *H05K 2201/09154* (2013.01); *H05K 2201/2009* (2013.01); *H05K 2201/2018* (2013.01); *H05K 2203/0228* (2013.01); *H05K 2203/0746* (2013.01); *H05K 2203/107* (2013.01); *Y10T 29/49155* (2015.01)

(56) References Cited

U.S. PATENT DOCUMENTS

| | | | |
|---|---|---|---|
| 6,046,077 | A | 4/2000 | Baba |
| 6,051,888 | A | 4/2000 | Dahl |
| 6,114,048 | A | 9/2000 | Jech et al. |
| 6,114,763 | A | 9/2000 | Smith |
| 6,224,711 | B1 | 5/2001 | Carden |
| 6,313,521 | B1 | 11/2001 | Baba |
| 6,317,333 | B1 | 11/2001 | Baba |
| 6,380,633 | B1 * | 4/2002 | Tsai .................. H01L 23/49838 257/690 |
| 6,445,062 | B1 | 9/2002 | Honda |
| 6,509,630 | B1 | 1/2003 | Yanagisawa |
| 6,703,704 | B1 | 3/2004 | Alcoe et al. |
| 6,756,685 | B2 | 6/2004 | Tao |
| 6,784,542 | B2 | 8/2004 | Fukasawa et al. |
| 6,944,945 | B1 | 9/2005 | Shipley et al. |
| 6,979,636 | B1 | 12/2005 | Lin et al. |
| 7,102,228 | B2 | 9/2006 | Kanda |
| 7,123,465 | B2 | 10/2006 | Crane et al. |
| 7,196,426 | B2 | 3/2007 | Nakamura et al. |
| 7,960,818 | B1 * | 6/2011 | Davis ............... H01L 23/49503 257/675 |
| 8,575,742 | B1 * | 11/2013 | Kim .................. H01L 23/49541 257/670 |
| 2001/0017408 | A1 | 8/2001 | Baba |
| 2002/0114144 | A1 | 8/2002 | Kumamoto et al. |
| 2003/0025180 | A1 | 2/2003 | Alcoe et al. |
| 2003/0178722 | A1 | 9/2003 | Xie et al. |
| 2004/0099958 | A1 | 5/2004 | Schildgen et al. |
| 2004/0150118 | A1 | 8/2004 | Honda |
| 2005/0230797 | A1 | 10/2005 | Ho et al. |
| 2005/0282310 | A1 | 12/2005 | Zhou |
| 2006/0208356 | A1 | 9/2006 | Yamano et al. |
| 2006/0249852 | A1 | 11/2006 | Chiu et al. |
| 2007/0183209 | A1 * | 8/2007 | Ni ...................... G06F 12/1416 365/185.22 |
| 2008/0001308 | A1 | 1/2008 | Chen |
| 2008/0054490 | A1 | 3/2008 | McLellan et al. |
| 2008/0073784 | A1 * | 3/2008 | Lee .................... H01L 23/3121 257/738 |
| 2008/0142996 | A1 | 6/2008 | Subramanian et al. |
| 2008/0272482 | A1 | 11/2008 | Jensen et al. |
| 2008/0291636 | A1 * | 11/2008 | Mori .................. H01L 23/3735 361/709 |
| 2013/0258619 | A1 * | 10/2013 | Ley ..................... H05K 7/1461 361/753 |

FOREIGN PATENT DOCUMENTS

| | | |
|---|---|---|
| JP | 3180794 | 4/2001 |
| JP | 3189270 | 5/2001 |
| JP | 3219043 | 8/2001 |
| JP | 3228339 | 9/2001 |
| JP | 2002190560 | 7/2002 |
| JP | 3367554 | 11/2002 |
| JP | 3384359 | 12/2002 |
| JP | 3385533 | 1/2003 |
| JP | 2003051568 | 2/2003 |
| JP | 3459804 | 8/2003 |
| JP | 2004260138 | 9/2004 |
| JP | 200767010 | 3/2007 |

OTHER PUBLICATIONS

U.S. Appl. No. 11/748,618, filed May 15, 2007, Tosaya.
U.S. Appl. No. 12/029,305, filed Feb. 11, 2008, Tosaya.
U.S. Appl. No. 12/051,330, filed Mar. 19, 2008, Topacio.
U.S. Appl. No. 12/198,227, filed Aug. 26, 2008, Khan et al.
Horatio Quinones et al.; *Flip Chip Encapsulation Reliability*; ASYMTEK; Aug. 1998; pp. 1-13.
Richard Blish, Ph.D.; *Use Condition Based Reliability Evaluation of New Semiconductor Technologies*; SEMATECH; Aug. 31, 1999; pp. 1-21.
National Electronics Center of Excellence; *Empfasis-Lead Free Soldering for Sustainment*; A publication of the National Electronics Manufacturing Center for Excellence; http://www.empf.org/empfasis/oct03/3403pbsustain.htm; Mar./Apr. 2003; pp. 1-3.
K.C. Norris et al.; *Reliability of Controlled Collapse Interconnections*; IBM J. Res. Development; May 1969; pp. 1-6.
Werner Engelmaier; *Solder Joints in Electronics: Design for Reliability*; 1999; pp. 1-13.
XILINX; Fine-Pitch BGA (FG456/FGG456) Package; www.xilinx.com; PK034 (v1.2.1); Mar. 23, 2005; p. 1.
Lisa Kosanovic; New Wires for Old; http://www.memagazine.org/supparch/pejun04/newwires/newwires.html; Mechanical Engineering "Power & Energy,"; Jun. 2004; pp. 1-5.
Wikipedia; Invar; http://en.wikipedia.org/wiki/Invar; unknown date; pp. 1-2.
Invar; http://asuwlink.uwyo.edu/-metal/invar.html; Aug. 11, 2007; pp. 1-3.
USPTO Office Action notification dated Oct. 23, 2015; U.S. Appl. No. 13/436,177.
Anton Shiloy; Xbit Laboratories Hardware News; *AMD Demos 17W Trinity Accelerated Processing Unit*; Jan. 11, 2012; pp. 1-11.
Tim Verry; PC Perspective News; *AMD Shows off Trinity APU Die and Trinity Powered Notebook*; Jan. 10, 2012; pp. 1-4.
Btarunr; www.techpowerup.com; *AMD Demonstrates Trinity APU, Its Own Thunderbolt-Alternative*; Jan. 11, 2012; pp. 1-9.

* cited by examiner

US 9,867,282 B2

CIRCUIT BOARD WITH CORNER HOLLOWS

This application claims benefit under 35 USC 119(e) of prior provisional application Ser. 61/866,698, filed Aug. 16, 2013.

BACKGROUND OF THE INVENTION

1. Field of the Invention

This invention relates generally to semiconductor processing, and more particularly to circuit boards for holding integrated circuits and to methods of making the same.

2. Description of the Related Art

Many current integrated circuits are formed as multiple dice on a common silicon wafer. After the basic process steps to form the circuits on the dice are complete, the individual dice are cut from the wafer. The cut dice are then often mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. An underfill material is deposited between the die and the substrate to act as a material that prevents damage to the solder bumps due to mismatches in the coefficients of thermal expansion between the die and the substrate, and an adhesive to hold the die. The substrate interconnects include an array of solder pads that are arranged to line up with the die solder bumps. After the die is seated on the substrate, a reflow process is performed to enable the solder bumps of the die to metallurgically bond to the solder pads of the substrate.

One conventional type of substrate consists of a core laminated between upper and lower build-up layers. The core itself usually consists of four layers of glass filled epoxy. The build-up layers, which may number four or more on opposite sides of the core, are formed from some type of polymer resin. Various metallization structures are interspersed in the core and build-up layers in order to provide electrical pathways between pins, pads or other solder balls on the lowermost layer of the substrate and the pads that bond with the chip solder bumps. The pins, pads or solder balls are designed to electrically interface with a pin grid array socket, a land grid array socket or a ball grid array land pattern of another electrical device, such as a printed circuit board.

The core provides a certain stiffness to the substrate. Even with that provided stiffness, conventional substrates still tend to warp due to mismatches in coefficients of thermal expansion for the chip, underfill and substrate. One conventional technique for shoring up the stiffness of a chip package substrate involves the mounting of a stiffener ring to an upper side of the package substrate. These types of conventional stiffeners are frequently fabricated from copper, aluminum or steel and require an adhesive to adhere to the substrate.

Circuit board warpage can artificially inflate the thickness or so-called "z-height" of the chip and circuit board combination. If placed in a conventional personal computer environment, space may not be limited so the thickness or z-height of the chip and circuit board combination may not be a significant concern. However, portable computing devices, such as smart phones and tablet computers, can often require a thin form factor. Indeed, thinness can both reduce the weight and increase the aesthetic appeal of portable devices. It is a technical challenge to reduce the z-height of a chip and circuit board combination while counteracting warpage effects. Thickening a circuit board core or using a stiffener ring can help, but these measures can also further add to z-height of the device. Another pitfall of warpage is the potential for the creation of solder joint defects in instances where solder balls are used as interconnects. This issue may arise both during system board mounting and subsequent system operation.

The present invention is directed to overcoming or reducing the effects of one or more of the foregoing disadvantages.

SUMMARY OF EMBODIMENTS OF THE INVENTION

In accordance with one aspect of an embodiment of the present invention, an apparatus is provided that includes a circuit board that has a first side adapted to have a semiconductor chip mounted thereon. The circuit board includes four corner hollows.

In accordance with another aspect of an embodiment of the present invention, a method of manufacturing is provided that includes singulating a circuit board from a substrate of plural of the circuit boards, wherein the circuit board is shaped to have four corner hollows.

In accordance with another aspect of an embodiment of the present invention, a method of manufacturing is provided that includes forming a circuit board as part of a substrate of plural of the circuit boards and singulating the circuit board from the substrate, wherein the circuit board is shaped to have four corner hollows.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various circuit boards, such as semiconductor chip package substrates, with warpage resistance are disclosed. In variant, the circuit board is fabricated with four corner hollows that tend to break up the outline of and shorten the edges of the circuit board. The hollows may be a variety of shapes. Additional details will now be described.

Figure 1:
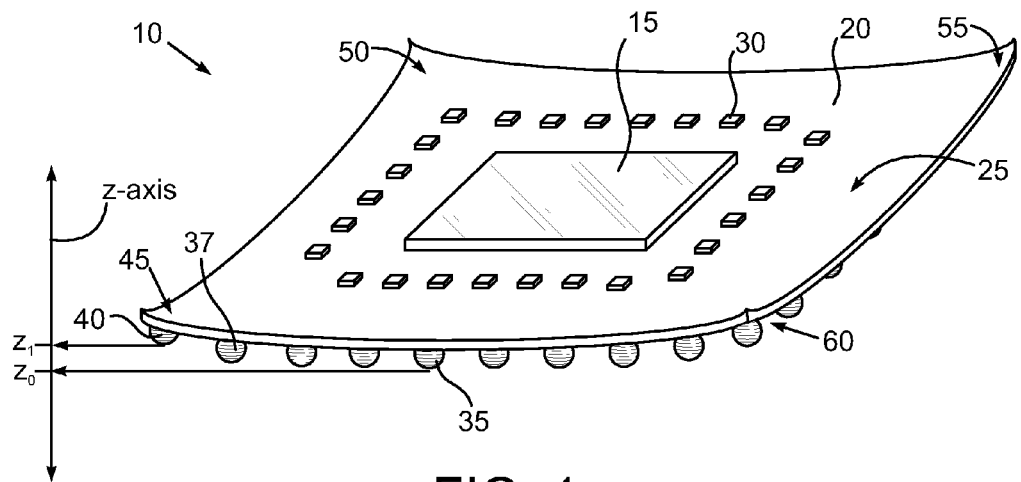
FIG. 1 is a pictorial view of an exemplary conventional semiconductor chip package.

In the drawings described below, reference numerals are generally repeated where identical elements appear in more than one figure. Turning now to the drawings, and in particular to FIG. 1, therein is shown a pictorial view of an exemplary conventional semiconductor chip package 10 that includes a semiconductor chip 15 mounted on a package substrate 20. The package substrate 20 is an organic build-up design that consists of plural build-up layers formed on a central core. The upper surface 25 of the package substrate 20 is populated with plural decoupling capacitors 30. To interface electrically with another component such as a circuit board (not shown), the package substrate 25 includes a ball grid array that consists of plural solder balls two of which are labeled 35 and 40. The conventional package substrate 20 depicted exhibits a warpage phenomena (exaggerated in the figure for visibility) that is common in conventional organic packages namely: warpage may be greater at the corners 45, 50, 55 and 60 of the substrate 20 as shown. As noted in the Background section above, substrate warpage may be due to a variety of mechanisms such as CTE mismatch. One potential fall out of substrate warpage is undesirable differences in the post warpage elevation of interconnects such as the solder balls 35, 37 and 40. Here, due to the warpage at the corners 45, 50, 55 and 60, the corner-located balls, such as the ball 40, may have some elevation $Z_1$ while more centrally located balls, such as the ball 35, have an elevation of $Z_0$ where $Z_1 > Z_0$ and the ball pitch may be distorted beyond design specifications. In other words, the pitch between balls 37 and 40 may be greater than design, which can lead to poor adhesion to an underlying bond pad. Other problems might include electrical shorts with an underlying circuit board or other device (not shown), improper solder reflow or solder joint breakage to name just a few. If the direction of warpage is in the opposite direction, then $Z_1 < Z_0$ and the ball pitch may be distorted in the opposite sense so that the balls 37 and 40 are closer than specification, which can lead to poor pad adhesion and shorts. In addition to ball pitch distortions, the warpage increases the effective z-height of the device 10 beyond what a more planar circuit board 20 would exhibit.

An exemplary embodiment of a semiconductor chip device 70 designed to address the technical deficiencies described above is depicted pictorially in FIG. 2. The exemplary semiconductor chip device 70 may include a semiconductor chip 75 mounted on a circuit board 80a. It should be understood that additional semiconductor chips (not shown) may be mounted on the circuit board 80a in addition to the semiconductor chip 75. The semiconductor chip 75 and any disclosed alternatives may be any of a myriad of different types of circuit devices used in electronics, such as, for example, microprocessors, graphics processors, combined microprocessor/graphics processors sometimes known as application processing units, application specific integrated circuits, memory devices or the like, and may be single or multi-core.

The circuit board 80a and any disclosed alternatives may be a package substrate, a circuit card, a system board or virtually any other type of printed circuit board. An organic embodiment of the circuit board 80a may consist of a core/build-up configuration. In this regard, the circuit board 80a may consist of a central core upon which one or more build-up layers are formed and below which an additional one or more build-up layers are formed. The core itself may consist of a stack of one or more layers. One example of such an arrangement may be termed a so called "2-4-2" arrangement where a four-layer core laminated between two sets of two build-up layers. The number of layers in the circuit board 80a can vary from four to sixteen or more, although less than four may be used. So-called "coreless" designs may be used as well. The layers of the circuit board 80a may consist of an insulating material, such as various well-known epoxies, interspersed with metal interconnects, such as traces and vias (not visible). Optionally, ceramic substrates may be used for the circuit board 80a.

An upper surface 85 of the circuit board 80a may be populated with plural components 90, which may be passive devices, such as capacitors, inductors or resistors, or other types of components as desired. To interface electrically with another device, such as a circuit board or other device (not shown), the circuit board 80a may be provided with the ball grid array consisting of plural solder balls 95. Optionally, a variety of other interconnect structures such as land grid arrays, pin grid arrays, or other types of interconnects such as conductive pillars with or without solder enhancement may be used.

Figure 3:
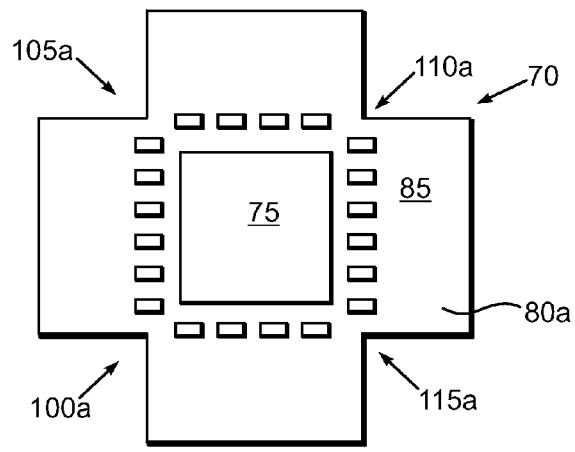
FIG. 3 is a plan view of the circuit board depicted in FIG. 2.

To compensate for corner warpage risks, the diagonally positioned corners depicted in the conventional design in FIG. 1, for example, 45 and 55 and 50 and 60 are eliminated by forming corner hollows 100a, 105a, 110a and 115a at the corner regions 116, 117, 118 and 119, respectively, of the circuit board 80a. The provision of the corner hollows (empty spaces) 100a, 105a, 110a and 115a acts to stiffen the circuit board 80a against the type of corner warpage described above. Some additional details of the semiconductor chip device 70 may be understood by referring now also to FIG. 3, which is an overhead view. The surface components 90 may be positioned around the periphery of the semiconductor chip 75 and track the perimeter thereof as shown in FIG. 3. As discussed in more detail below, various types of spatial arrangements for the components 90 may be used as well. Here, the circuit board 80a has a generally square footprint and the corner hollows 100a, 105a, 110a and 115a may have a generally square footprint as well. However, the circuit board 80 and any disclosed alternatives may have a variety of different footprints as shown and described below. It should be understood that although the surface components 90 are mounted on the upper surface 85 of the circuit board 80a, additional components (not visible) may be mounted on the reverse side 97 of the circuit board 80a.

Figure 2:
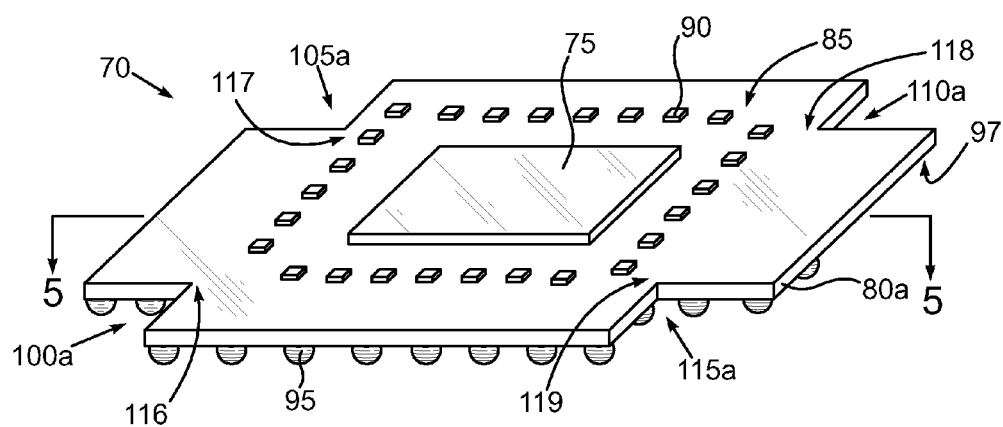
FIG. 2 is a pictorial view of an exemplary embodiment of a semiconductor chip device that includes a semiconductor chip mounted on a circuit board.
Figure 4:
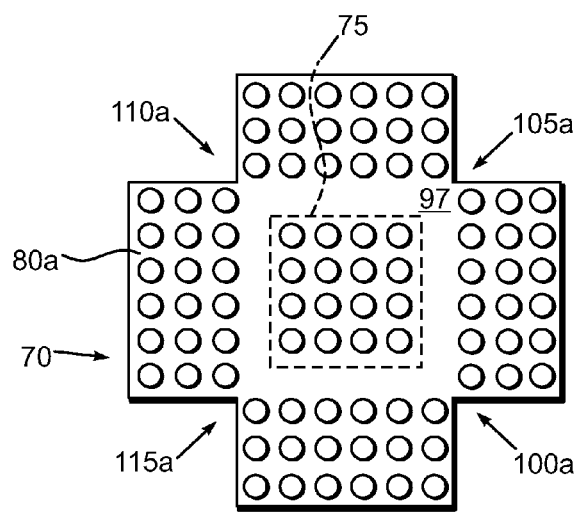
FIG. 4 is an underside view of the semiconductor chip device 70 depicted in FIG. 3.

The arrangement of the interconnects, such as the solder balls 95 depicted in FIG. 2, may be varied according to a variety of considerations. In this regard, attention is now turned to FIG. 4, which is a plan view of the underside 97 of the circuit board 80a. Note that the solder balls 95 are visible but the semiconductor chip 75 is obscured and thus shown in phantom. Here, the solder balls 95 may be arranged around the perimeter of the circuit board 80a. In some embodiments, the solder balls 95 that are located closest to the outer edges of the circuit board 80 may be used to convey power and ground while those solder balls 95 that are positioned closer to the semiconductor chip 75 may be devoted to the signal propagation. However, these considerations will vary depending upon the functionality of the semiconductor chip 75 and the circuit board 80*a*. In any event, those interconnects that would have been positioned proximate the locations of the corner hollows 100*a*, 105*a*, 110*a* and 115*a* need not result in a loss in performance since performance typically improves with decreasing distance from the semiconductor chip 75.

Figure 5:
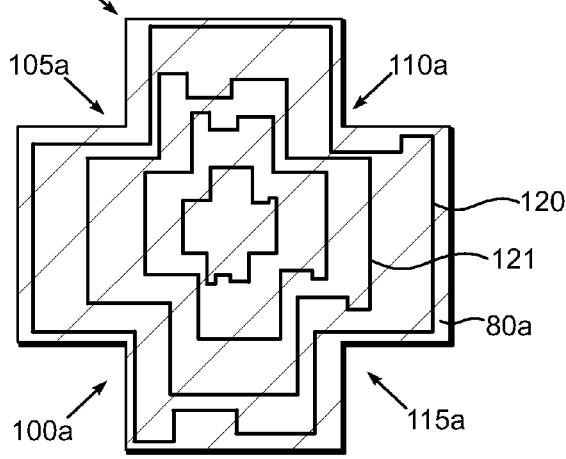
FIG. 5 is a sectional view of FIG. 2 taken at section 5-5.

The provision of the corner hollows 100*a*, 105*a*, 110*a* and 115*a* need not adversely impact the routing of electrical traces within the circuit board 80*a*. In this regard, attention is now turned to FIG. 5, which is a sectional view of FIG. 2 taken at section 5-5. Section 5-5 passes through any one of the interconnect layers of the circuit board 80*a*. A few of the multitude of conductor traces that may be present within a given interconnect layer of the circuit board 80 are shown and a couple of those are labeled 120 and 121, respectively. Note that the locations of the corner hollows 100*a*, 105*a*, 110*a* and 115*a* are not particularly desirable for conductor traces locations from a performance standpoint, since these locations tend to be furthest away from where the semiconductor chip is located and thus presents potential issues of latency associated with inductance and other factors. Therefore, the semiconductor chip device 70 may have desirable electrical performance with the provision of the corner hollows 100*a*, 105*a*, 110*a* and 115*a*.

Figure 6:
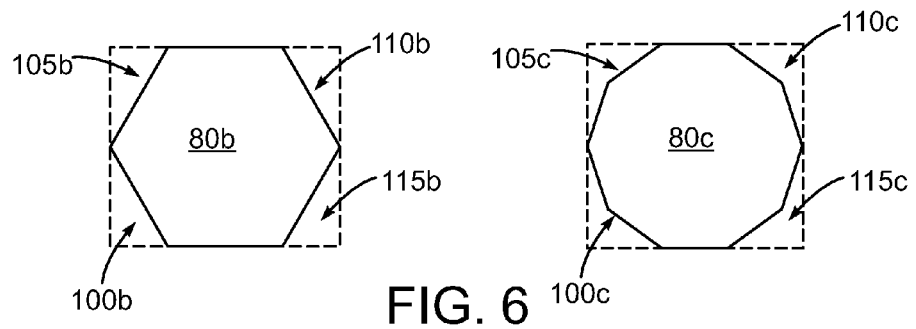
FIG. 6 is a plan view of a couple of alternate exemplary chip device circuit boards.

In the embodiment depicted in FIGS. 2-5, the corner hollows 100*a*, 105*a*, 110*a* and 115*a* are rectangular. However, other shapes are possible. As shown in FIG. 6, a circuit board 80*b* with a hexagonal footprint has triangular corner hollows 100*b*, 105*b*, 110*b* and 115*b*, while a circuit board 80*c* with a decagon footprint has more irregular corner hollows 100*c*, 105*c*, 110*c* and 115*c*.

Figure 7:
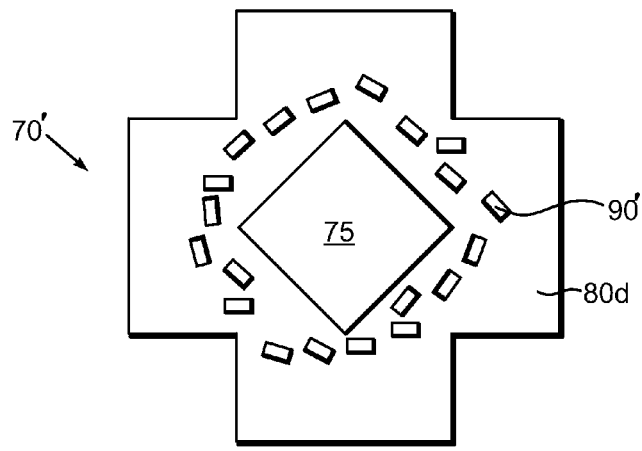
FIG. 7 is a plan view like FIG. 3 but of an alternate exemplary semiconductor chip device.

As discussed briefly above, in conjunction with FIG. 3, the components 90 may be arranged in a variety of ways relative to the semiconductor chip 75. In this regard, attention is turned now to FIG. 7, which is an overhead view like FIG. 3 but of an alternate exemplary embodiment of a semiconductor chip device 75 mounted on the circuit board 80*d*. However, here the surface components 90' may be arranged in a semi-regular circular pattern around the perimeter of the semiconductor chip 75. In addition, the semiconductor chip 75 is rotated about an axis perpendicular to the plane of the page relative to the circuit board 80*d*. It should be understood that the axial orientation of the semiconductor chip 75 may be virtually any angle relative to the underlying circuit board 80*d*, and the semiconductor chip 75 need not be centrally located on the circuit board 80*d*.

Figure 8:
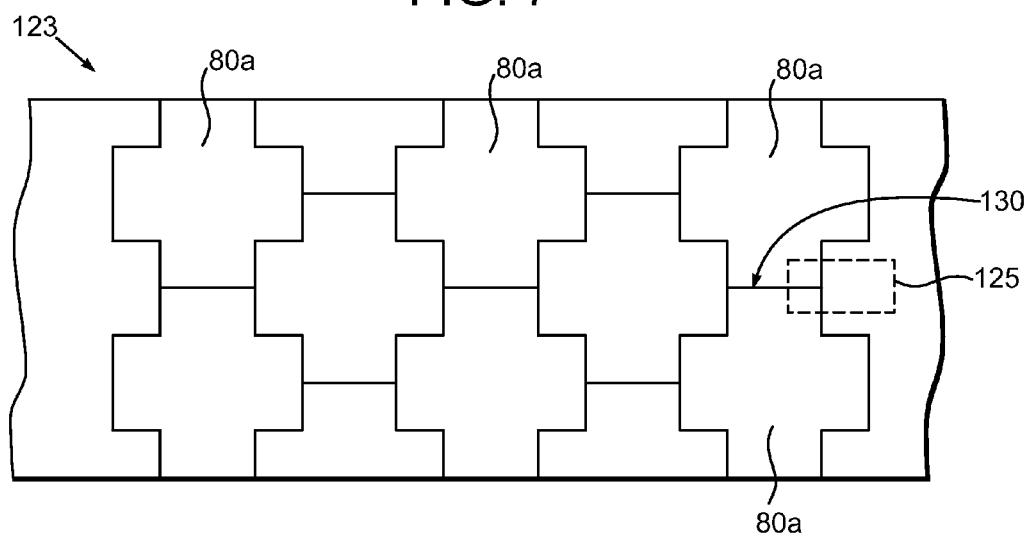
FIG. 8 is a plan view of a portion of an exemplary strip of circuit boards.
Figure 9:
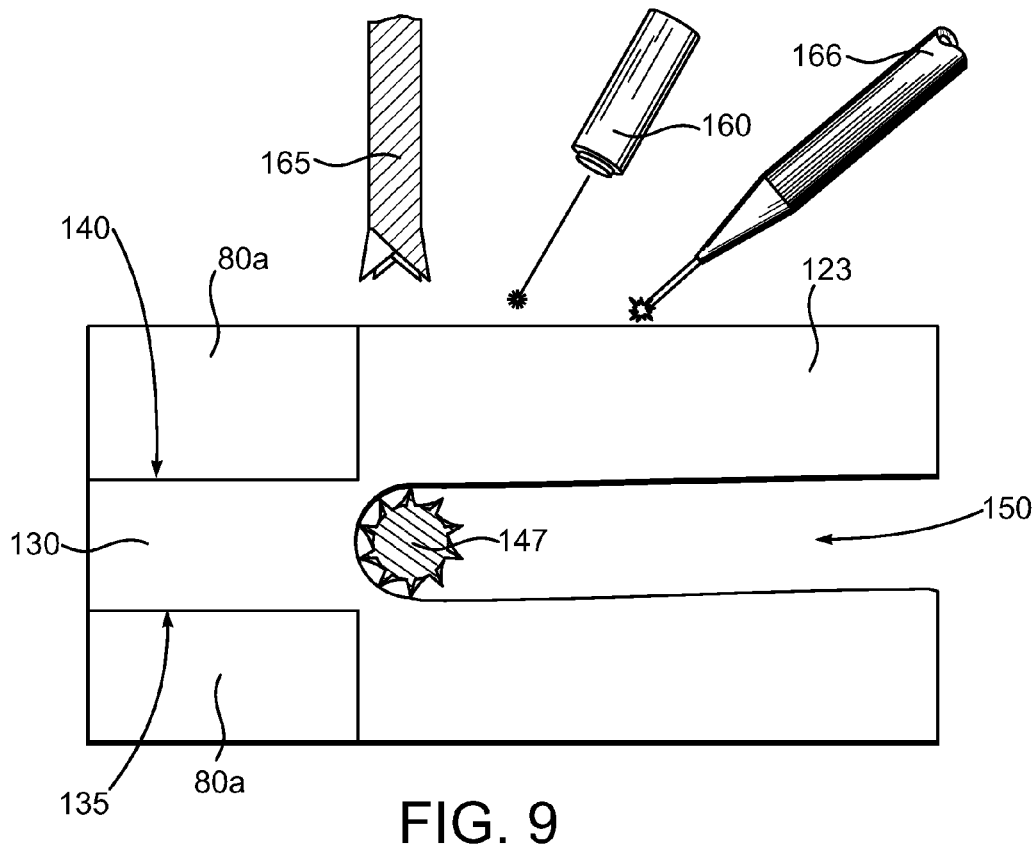
FIG. 9 is a portion of FIG. 6 shown at greater magnification and depicting some exemplary singulation techniques.

An exemplary method of fabricating the circuit board 80*a* may be understood by referring now to FIGS. 8 and 9. Although the circuit boards 80*a* could be manufactured on a discrete basis, a more economical scenario involves fabricating the circuit boards 80*a* en masse in a strip or other substrate as shown. For example, FIG. 8 depicts an overhead view of an exemplary strip 123 of plural circuit boards 80*a* again with the cross shape of this illustrative embodiment. Again the techniques to actually form the circuit boards 80*a* may involve the application of build up layers to a core or in coreless designs the mere application of build up layers. Sequential fabrication of one or more interconnect layers, involving patterned conductor lines and vias, may be performed using well-known techniques. Mounting of the components 90 may be performed at this stage or later.

At some point in the manufacturing process, it is appropriate to singulate the circuit boards 80*a* from the strips 120. The circuit boards 80*a* may be divided from one another by plural dicing streets, one of which is labeled 130. The dicing streets are selected to yield the desired circuit board footprint complete with corner cutouts. The singulation process may be accomplished in a variety of ways. To illustrate a couple of exemplary processes the portion of the strip 123 circumscribed by the dashed rectangle 125 will be shown at greater magnification in FIG. 9. With that backdrop, attention is now turned to FIG. 9, which as just noted depicts the portion of the strip 123 circumscribed by the dashed rectangle 125. Here, portions of two of the circuit boards 80*a* are illustrated along with a portion of the strip 123 itself and the dicing street 130. At the dicing street 130 the intended post-singulation edges 135 and 140 of the adjacent circuit boards 80 are set back to accommodate the cutting process. In this illustrative embodiment, the strip 123 may be cut by way of a mill bit 147 which is depicted as making a straight but somewhat irregular cut 150. The skilled artisan will appreciate that the cut 150 may be quite straight in actuality and the mill bit 145 will likely be under numerical control. Other types of cutting techniques, such as laser cutting with a laser source 160, or cutting by way of a saw blade 165 or water jet 166 may be used to cleave the circuit boards 80*a* from the strip 123. It should be noted that the singulation of the circuit boards 80*a* and shaping of the hollows 100*a*, 105*a*, 110*a* and 115*a* (see FIGS. 2-5) can be performed as a single operation or as separate operations.

Figure 10:
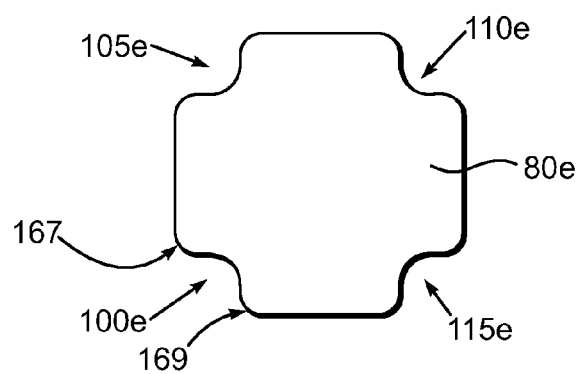
FIG. 10 is a plan view of another alternate exemplary embodiment of a semiconductor chip device circuit board.

It may be desirable to add curvature to the footprints of the circuit boards to account for the cylindrical shape of the bit 147. For example, and as shown in FIG. 10, the footprint of the an alternative circuit board 80*e* may include concave corner hollows 100*e*, 105*e*, 110*e* and 115*e*, and corners 167 and 169 adjacent a given corner hollow, for example 100*e*, may be arcuate or curved. Any disclosed alternatives to the circuit board 80*e* may use these features.

Figure 11:
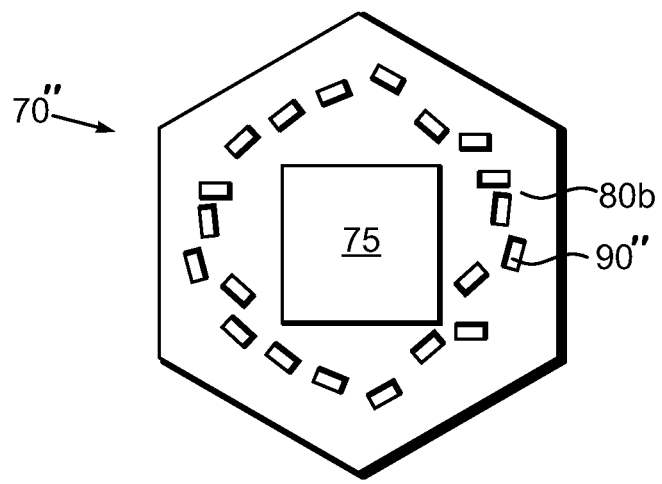
FIG. 11 is a plan view of another alternate exemplary embodiment of a semiconductor chip device.

As noted above, the embodiments of the circuit boards described herein may take on a variety of shapes that provide resistance to corner warpage. In this regard, attention is now turned to FIG. 11, which is a plan view of an alternate exemplary embodiment of a semiconductor chip device 70" which includes the semiconductor chip 75 mounted on the hexagonal circuit board 80*b*. The upper surface 85 of the circuit board 80*b* may again be populated with the surface components 90" here in a semi-regular circular pattern around the semiconductor chip 75. The usage of a hexagonal footprint for the circuit board 80*b* reduces the span between corner like structures so that there will be a reduced propensity for corner warpage.

Figure 12:
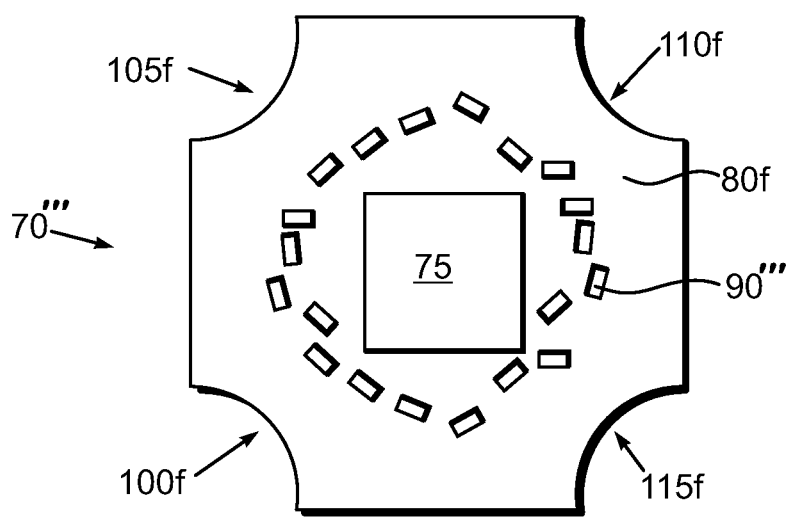
FIG. 12 is a plan view of another alternate exemplary embodiment of a semiconductor chip device.

Another alternate exemplary embodiment of a semiconductor chip device 70''' may be understood by referring now to FIG. 12, which is a plan view. Here, the semiconductor chip device 70''' may include a semiconductor chip 75 mounted on a circuit board 80*f* which includes concave corner hollows 100*f*, 105*f*, 110*f* and 115*f*. The surface components 90''' may be as described above in conjunction with the other embodiments. The usage of concave corner hollows 100*f*, 105*f*, 110*f* and 115*f* again reduces the span length between corner-like structures.

Figure 13:
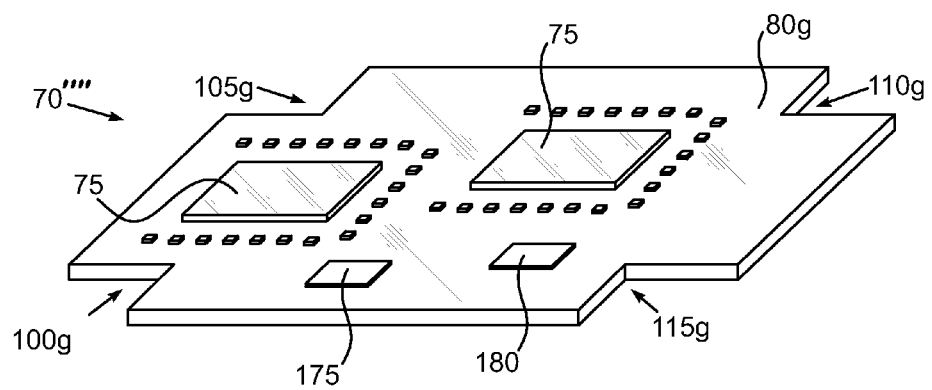
FIG. 13 is a pictorial view of an alternate exemplary embodiment of a semiconductor chip device.

In the foregoing illustrative embodiments, the semiconductor chip devices 70, 70', 70" and 70''' are configured as semiconductor chip packages with package substrates. However, the skilled artisan will appreciate that the usage of corner modification in order to suppress corner warpage may be applied to other types of circuit boards. For example, FIG. 13 depicts a pictorial view of a semiconductor chip device 70"" that includes plural semiconductor chips 75, 175 and 180 mounted on a circuit board 80g. The circuit board 80g may be virtually any type of printed circuit board, and as such, may include various surface components 90"", which may be passive devices described above or other types of integrated circuits or components. Again, while the circuit board 80g is depicted as having a rectangular footprint with rectangular corner hollows 100g, 105g, 110g and 115g, other footprints as described herein may be used.

Figure 14:
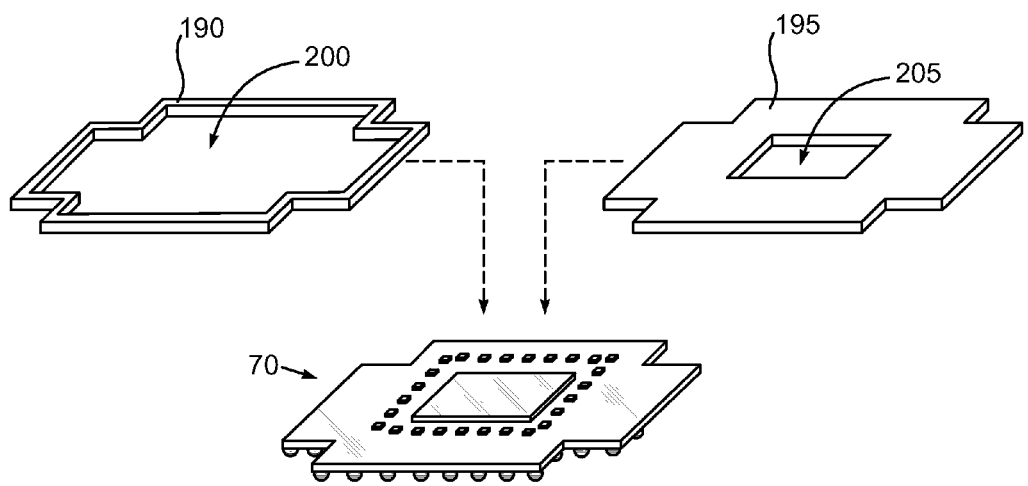
FIG. 14 is a pictorial view of an exemplary embodiment of a semiconductor chip device that may be used with various stiffener frames.

It may be useful to incorporate a stiffener frame into a semiconductor chip that has corner cut outs. In this regard, attention is now turned to FIG. 14, which is a pictorial view of a semiconductor chip device 70 and two examples of stiffener frames 190 and 195 respectively that may be mounted on the semiconductor chip device 70 to provide additional stiffening. The stiffener frame 190 may have a footprint that tracks the footprint of the semiconductor chip device 70 but with a relatively large internal opening 200. The footprint of the opening 200 may track the outline of the frame 190 itself. In the other alternative stiffener frame 195, the internal opening 205 may be made much smaller while still large enough to accommodate the semiconductor chip 75. The frame 195 is a more robust structure and thus may provide perhaps greater stiffness than the frame 190 example depending upon the bulk modulii of the frames 190 and 195. The frames 190 and 195 may be constructed of well-known metals, such as stainless steel, copper, aluminum or the like, or plastics, and may be secured to the semiconductor chip device 70 by way of well-known adhesives or even solders if issues associated with potential short circuits may be overcome.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
a circuit board having a first side configured to have a semiconductor chip mounted thereon and four corner hollows, the circuit board having a perimeter partially defined by the four corner hollows; and
wherein the circuit board includes an interconnect layer having plural conductor traces to conduct current and that track the perimeter.

2. The apparatus of claim 1, wherein the corner hollows comprise concave shapes.

3. The apparatus of claim 1, wherein the corner hollows comprise rectangular shapes.

4. The apparatus of claim 1, comprising a semiconductor chip mounted on the first side of the circuit board.

5. The apparatus of claim 1, comprising plural surface components mounted to the first side of the circuit board.

6. The apparatus of claim 1, wherein the circuit board comprises a semiconductor chip package substrate.

7. The apparatus of claim 1, wherein the circuit board has a hexagonal footprint.

8. The apparatus of claim 1, wherein the circuit board comprises a plurality of outer edges and a second side opposite to the first side, the second side having a plurality of interconnect structures to electrically interface with another device, the interconnect structures located closest to the outer edges being connected to power or ground.

9. The apparatus of claim 1, wherein the semiconductor chip package substrate comprises a core and plural build-up layers positioned on the core.

10. An apparatus, comprising:
a semiconductor chip package substrate having a first side, a second side opposite to the first side, four corner hollows and outer edges defined in part by the four corner hollows;
plural interconnect structures coupled to the second side to electrically interface with another device, those of the interconnect structures positioned closer to the edges than the other interconnect structures being operable to convey power and ground and the other interconnect structures being operable to convey signals; and
a semiconductor chip mounted on the first side.

11. The apparatus of claim 10, wherein the corner hollows comprise concave shapes.

12. The apparatus of claim 10, wherein the corner hollows comprise rectangular shapes.

13. The apparatus of claim 10, comprising plural surface components mounted to the first side of the semiconductor chip package substrate.

14. The apparatus of claim 10, wherein the semiconductor chip package substrate has a hexagonal footprint.

15. The apparatus of claim 10, wherein the interconnect structures comprise solder balls.

16. The apparatus of claim 10, wherein the interconnect structures comprise a land grid array.

17. The apparatus of claim 10, wherein the circuit board comprises a core and plural build-up layers positioned on the core.

18. An apparatus, comprising:
a semiconductor chip package substrate having a first side and four corner hollows and a first footprint defined in part by the four corner hollows;
a semiconductor chip mounted on the first side; and
a stiffener frame mounted on the first side, the stiffener frame having a second footprint that tracks the first footprint.

19. The apparatus of claim 18, wherein the stiffener frame includes an internal opening having a perimeter that tracks the second footprint.

20. The apparatus of claim 18, wherein the semiconductor chip package substrate has a hexagonal footprint.

* * * * *